United States Patent [19]
Ohkawa

[11] Patent Number: 5,353,289
[45] Date of Patent: Oct. 4, 1994

[54] FAULT JUDGING DEVICE COMPRISING A COMPRESSION CIRCUIT FOR COMPRESSING OUTPUT PATTERN SIGNALS OF A CIRCUIT MODEL

[75] Inventor: Kenzo Ohkawa, Tokyo, Japan
[73] Assignee: NEC Corporation, Japan
[21] Appl. No.: 785,820
[22] Filed: Oct. 31, 1991
[30] Foreign Application Priority Data
  Oct. 31, 1990 [JP] Japan ............. 2-292097
[51] Int. Cl.$^5$ ............................. G06F 11/28
[52] U.S. Cl. .................. 371/23; 364/571.04; 364/578
[58] Field of Search ........ 371/23; 364/571.04, 364/578

[56] References Cited

U.S. PATENT DOCUMENTS

| | | | |
|---|---|---|---|
| 4,725,971 | 2/1988 | Doshi et al. | 371/23 |
| 4,937,770 | 6/1990 | Samuels et al. | 371/23 |
| 4,945,503 | 3/1990 | Takasaki | 371/23 |
| 4,996,659 | 2/1991 | Yamaguchi et al. | 371/23 |
| 5,058,112 | 10/1991 | Namitz et al. | 371/23 |

Primary Examiner—Jack B. Harvey
Assistant Examiner—Thomas Peeso
Attorney, Agent, or Firm—Ostrolenk, Faber, Gerb & Soffen

[57] ABSTRACT

In a fault judging device for use in simulating a circuit model which is defined by a fault data signal indicative of one of circuit elements in the circuit model and which is operable in response to first through n-th input pattern signals to produce first through n-th output pattern signals, a compression circuit compresses the first through the n-th output pattern signals by cyclic coding to produce a compressed signal represented by a cyclic code sequence. A comparator compares the cyclic code sequence with a specific code sequence which defines a normal circuit related to the circuit model. The comparator produces a comparison result signal, as a judging result signal, representative of fault of one of the circuit elements when the cyclic code sequence does not coincide with the specific cyclic code sequence.

2 Claims, 4 Drawing Sheets

FAULT JUDGING DEVICE COMPRISING A COMPRESSION CIRCUIT FOR COMPRESSING OUTPUT PATTERN SIGNALS OF A CIRCUIT MODEL

BACKGROUND OF THE INVENTION

This invention relates to a fault judging device which is for use in simulating a circuit model. Such a fault judging device is particularly useful in a fault simulator.

A conventional fault simulator is implemented by a computer system which is operable in accordance with a predetermined software program. The fault simulator carries out a fault simulation of a circuit model which comprises a plurality of circuit elements. In the fault simulation, one of the circuit elements is selectively enabled at first by a fault data signal indicative of one of the circuit elements in the circuit model. Then, the circuit model is supplied with first through n-th input pattern signals, one by one, representative of first through n-th input patterns where n represents a natural number greater than unity. The first through the n-th input pattern signals are propagated through the circuit model one by one and processed in a processing time duration. As a result, the circuit model produces first through n-th output pattern signals, one by one, representative of first through n-th output patterns which are in one-to-one correspondence to the first through the n-th input patterns.

The fault simulator comprises a fault judging device comprising a pattern memory, such as a magnetic disc device, for memorizing first through n-th normal patterns for defining a normal circuit related to the circuit model. The fault judging device further comprises a comparator connected to the circuit model and the pattern memory for comparing the first through the n-th output patterns with the first through the n-th normal patterns, respectively. When one of the first through the n-th output patterns does not coincide with one of the first through the n-th normal patterns that corresponds to one of the first through the n-th output patterns, the comparator produces a comparison result signal representative of stack fault (Stack at "1" or "0") of one of the circuit elements.

In such a fault simulator, the circuit model is implemented by hardware circuits in order to reduce the processing time duration in the circuit model. However, the fault judging device requires a long time duration in order to carry out comparing operation between the first through the n-th output patterns and the first through the n-th normal output patterns. Furthermore, the fault judging device requires the pattern memory of a large capacity for memorizing first through n-th normal output patterns.

SUMMARY OF THE INVENTION

It is therefore an object of this invention to provide a fault judging device which is capable of carrying out comparing operation in a short time.

It is another object of this invention to provide a fault judging device of the type described, which may not use a pattern memory of a large capacity.

On describing the gist of this invention, it is possible to understand that a fault judging device is for use in simulating a circuit model which is defined by a fault data signal indicative of one of circuit elements in the circuit model to produce a judging result signal. The circuit model is operable in response to first through n-th input pattern signals and produces first through n-th output pattern signals where n represents a natural number greater than unity.

According to this invention, the fault judging device comprises: signal producing means connected to the circuit model for producing the fault data signal for selectively enabling one of the circuit elements; a compression circuit connected to the circuit model for compressing the first through the n-th output pattern signals by cyclic coding to produce a compressed signal represented by a cyclic code sequence; a cyclic code memory for memorizing a specific cyclic code sequence which defines a normal circuit related to the circuit model; and comparing means connected to the compression circuit and the cyclic code memory for comparing the cyclic code sequence with the specific cyclic code sequence. The comparing means produces a comparison result signal, as the simulation result signal, representative of fault of one of the circuit elements when the cyclic code sequence does not coincide with the specific cyclic code sequence.

DESCRIPTION OF THE PREFERRED EMBODIMENT

Figure 1:
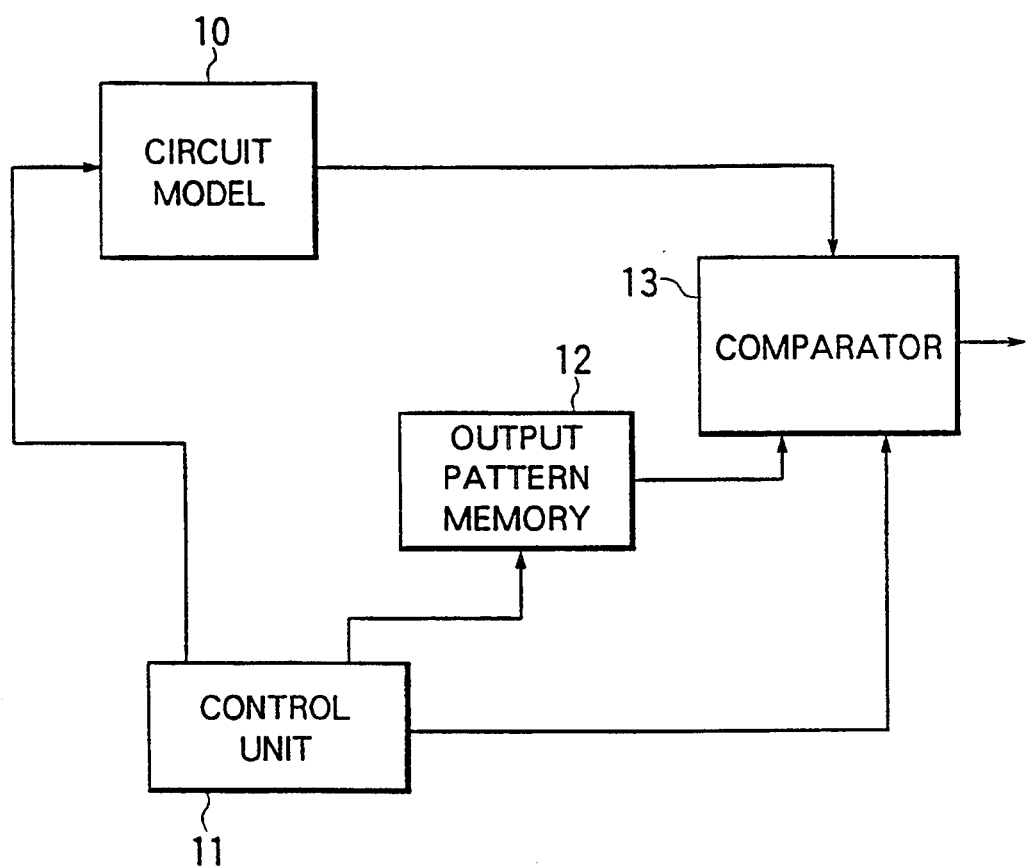
FIG. 1 is a block diagram of a conventional fault judging device connected to a circuit model.

Referring to FIG. 1, description will be made as regards a conventional fault judging device in order to facilitate a clear understanding of this invention. The fault judging device is operable as a part of a fault simulator known in the art.

In FIG. 1, a circuit model 10 comprises a plurality of circuit elements (not shown) implemented by hardware circuits. The circuit elements are numbered from 1 to k where k represents a first natural number greater than unity. The fault judging device comprises a control unit 11, an output pattern memory 12, and a comparator 13. The control unit 11 comprises a control memory (not shown). As will shortly be described, the control memory memorizes first through m-th fault data as first through m-th memorized fault data where m represents a second natural number greater than unity. The first through the m-th fault data are for indicating the circuit elements in the circuit model 10 and input and output terminals of the circuit elements as well known in the art. The control memory further memorizes first through n-th input patterns as first through n-th memorized input patterns where n represents a third natural number greater than unity. The output pattern memory 12 memorizes first through n-th normal output patterns as first through n-th memorized normal patterns which are in one-to-one correspondence to the first through the n-th input patterns and which define a normal circuit related to the circuit model 10.

Figure 2:
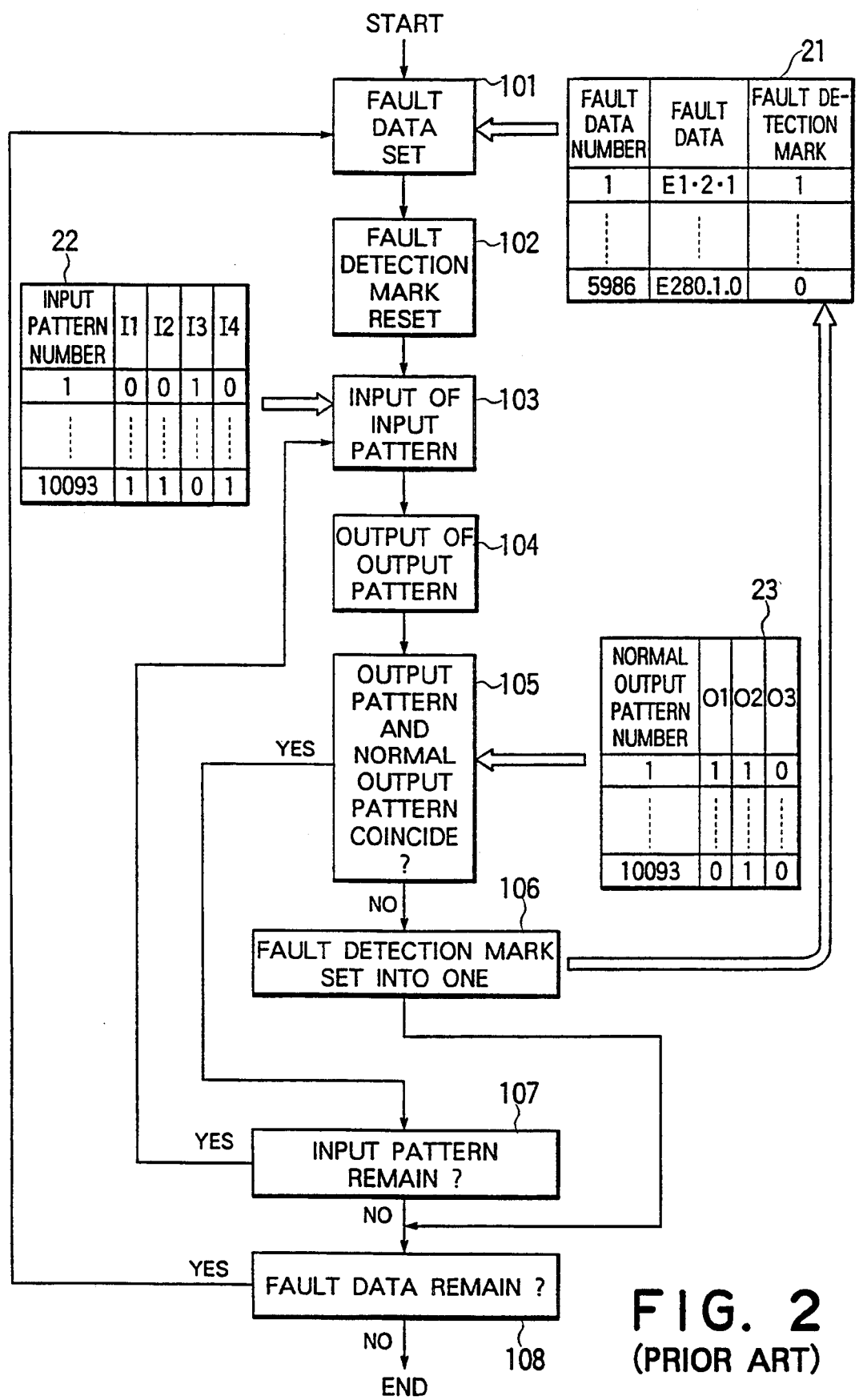
FIG. 2 is a flow chart for use in describing judging operation of the fault judging device illustrated in FIG. 1.

Referring to FIG. 2, the description will proceed to a fault judging operation of the circuit model 10.

In FIG. 2, first through 5986-th fault data are indicated at fault data numbers 1 to 5,986 as shown in a fault data table 21. This means that the second natural number m is equal to 5,986. Each of the first through the 5986-th fault data comprises circuit element number data, terminal number data of the circuit element, and stack fault data (Stack at "1" or "0"). For example, the first fault data comprises a first circuit element number data indicative of a first circuit element as depicted at E1, a first terminal number data indicative of a terminal number 2 of the first circuit element, and a first stack data represented by a logic "1" value. The 5986-th fault data comprises a 280-th circuit element number data indicative of a 280-th circuit element as depicted at E280, a 5986-th terminal number data indicative of the terminal number 1 of the 280-th circuit element, and the stack data represented by a logic "0" value. This means that the first natural number x is equal to 280. In the fault data table 21, a fault detection mark is put into one when the fault judging device judges that the circuit element has a fault as will shortly be described. Otherwise, the fault detection mark is put into zero. The fault data table 21 is stored in the control memory.

At a first step 101, the first memorized fault data is read out of the control memory and is supplied to the circuit model 10 as a first fault data signal to define the first circuit element E1 in the circuit model 10. At a second step 102, a first fault detection mark related to the first fault data is initialized to zero. At a third step 103, the first memorized input pattern is read out of the control memory and is supplied to the circuit model 10 as a first input pattern signal.

In FIG. 2, first through 10,093-th input patterns are indicated at input pattern numbers 1 to 10,093 as shown in an input pattern table 22. This means that the third natural number n is equal to 10,093. For convenience, it will be assumed that each of the first through the 10,093-th input patterns consists of first through fourth bits I1, I2, I3, and I4. For example, the first input pattern has a four-bit pattern of (0010). The 10,093-th input pattern has the four-bit pattern of (1101). In practice, each of the first through the 10,093-th input patterns consists of 64 through 128 bits. The input pattern table 22 is stored in the control memory.

At a fourth step 104, the first input pattern signal is propagated through the circuit model 10. As a result, the circuit model 10 produces a first output pattern signal which represents a first output pattern. The first output pattern signal is supplied to the comparator 13.

In FIG. 2, first through 10,093 normal output patterns are indicated at normal output pattern numbers 1 to 10,093 as shown in an output pattern table 23. Each normal output pattern is equal in bit number to each output pattern produced by the circuit model 10. For convenience, each of the first through the 10,093 normal output patterns consists of first through third bits 01, 02, and 03. For example, the first normal output pattern has a three-bit pattern of (110). The 10,093-th normal output pattern has the three-bit pattern of (010). The output pattern table 23 is stored in the output pattern memory 12.

At a fifth step 105, the first memorized normal pattern is read out of the output pattern memory 12 and is supplied to the comparator 13 as a first normal output pattern signal. Supplied with the first output pattern signal and the first normal output pattern signal, the comparator 13 compares the first output pattern with the first memorized normal pattern. If the first output pattern does not coincide with the first memorized normal pattern, the fifth step 105 is followed by a sixth step 106. Otherwise, the fifth step 105 is succeeded by a seventh step 107.

At the sixth step 106, the first fault detection mark related to the first fault data is put into one. At the seventh step 107, the control unit 11 judges whether or not a remaining input pattern is present. If the remaining input pattern does not present, the seventh step 107 is followed by an eighth step 108. When the remaining input pattern is present, the seventh step 107 turns back to the third step 103. The third through the seventh steps are repeated in connection with the first circuit element E1 until the comparing operation between a 10,093-th output pattern and the 10,093-th memorized normal pattern completes. At the eighth step 108, the control unit 11 judges whether or not remaining fault data are present. If the remaining fault data are not present, the fault judging operation is completed. When the remaining data are present, the eighth step 108 turns back to the first step 101. Then, the fault judging operation is carried out in connection with the circuit element defined by second fault data through the first through the eighth steps 101 to 108. The fault judging operation is repeated until the fault data number becomes equal to 5986.

As obvious from the above description, the fault judging device requires a long time duration in order to carry out the comparing operation between the first through the 5986-th output patterns and the first through the 5986-th memorized normal patterns. Furthermore, the fault judging device requires the output pattern memory 12 of a large capacity for memorizing the first through the 5986-th normal output patterns. For example, the output pattern memory 12 has a capacity of one hundred and sixty megabits.

Figure 3:
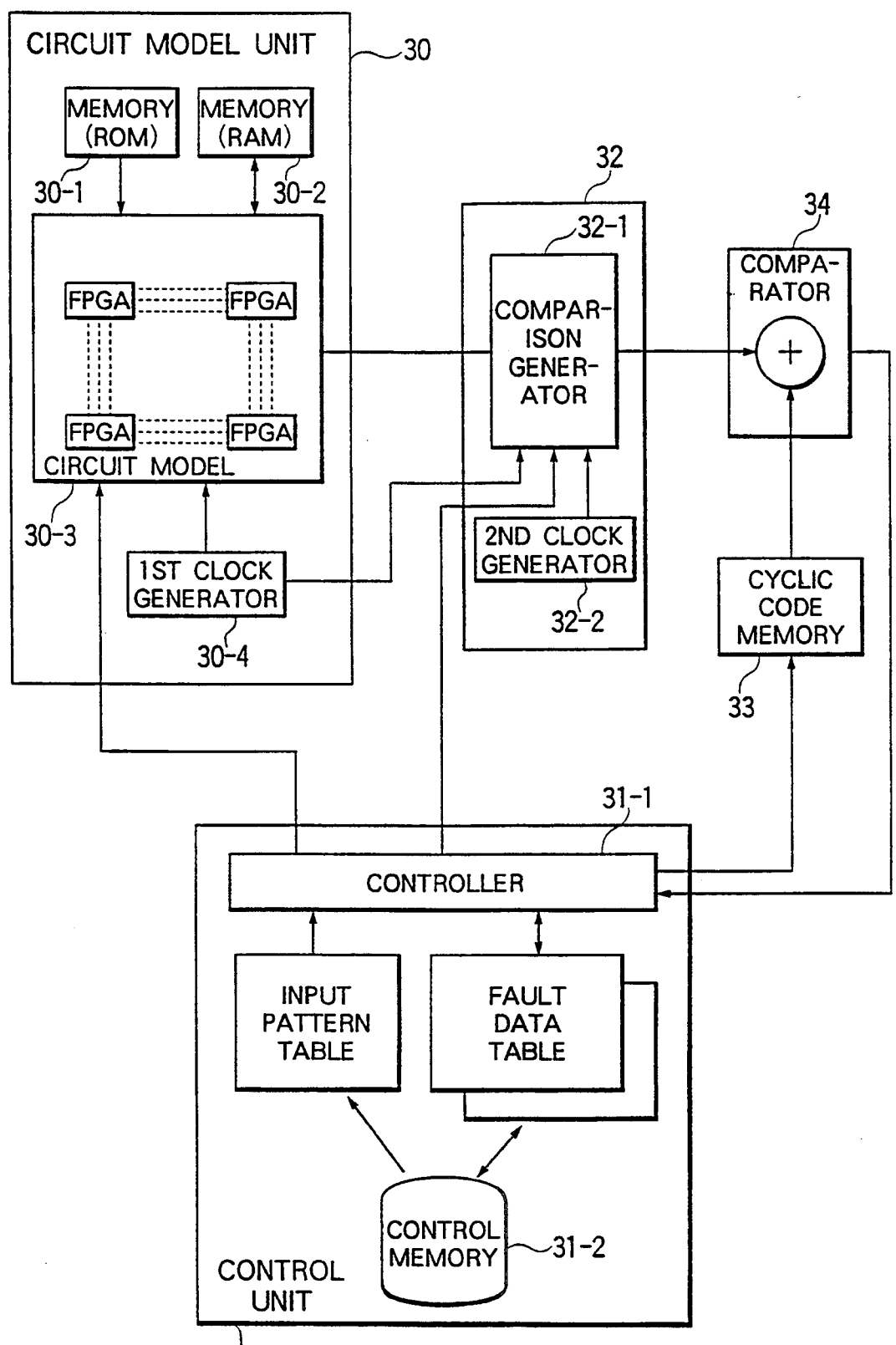
FIG. 3 is a block diagram of a circuit model unit and a fault judging device according to a preferred embodiment of this invention.

Referring to FIG. 3, the description will proceed to a fault judging device according to a preferred embodiment of this invention. The fault judging device is operable as a part of a fault simulator and is connected to a circuit model unit 30. The fault judging device comprises a control unit 31 connected to the circuit model unit 30, a compression circuit 32 connected to the circuit model unit 30 and the control unit 31, a cyclic code memory 33 connected to the control unit 31, and a comparator 34 connected to the compression circuit 32 and the cyclic code memory 33. The circuit model unit 30 comprises a first memory 30-1 implemented by an ROM (read only memory), a second memory 30-2 implemented by an RAM (random access memory), a circuit model 30-3 implemented by a hardware circuit comprising a plurality of FPGA (field programmable gate array) units depicted at FPGA, and a first clock generator 30-4 for producing a first clock pulse signal. The first memory 30-1 is for memorizing a test program for generating first through n-th input patterns. Each of the FPGA units consists of a plurality of circuit elements.

The control unit 31 is implemented by a computer system known in the art and comprises a controller 31-1 connected to the circuit model unit 30 and a control memory 31-2, such as a magnetic disc memory, storing a fault data table and an input pattern table both of which are described in conjunction with FIG. 2. The control unit 31 may be called a signal producing unit. The compression circuit 32 comprises a cyclic redundancy code compression register 32-1 which is known in the art and a second clock generator 32-2 for producing a second clock pulse signal. The compression circuit 32 produces a compressed signal represented by a cyclic code sequence of sixteen bits. Such a compression circuit is implemented by an LSI standardized by the International Telegraph and Telephone Consultive Committee (CCITT). The cyclic code memory 33 memorizes a specific cyclic code sequence consisting of sixteen bits as a memorized specific cyclic code sequence which defines a normal circuit related to the circuit model 30-3.

Figure 4:
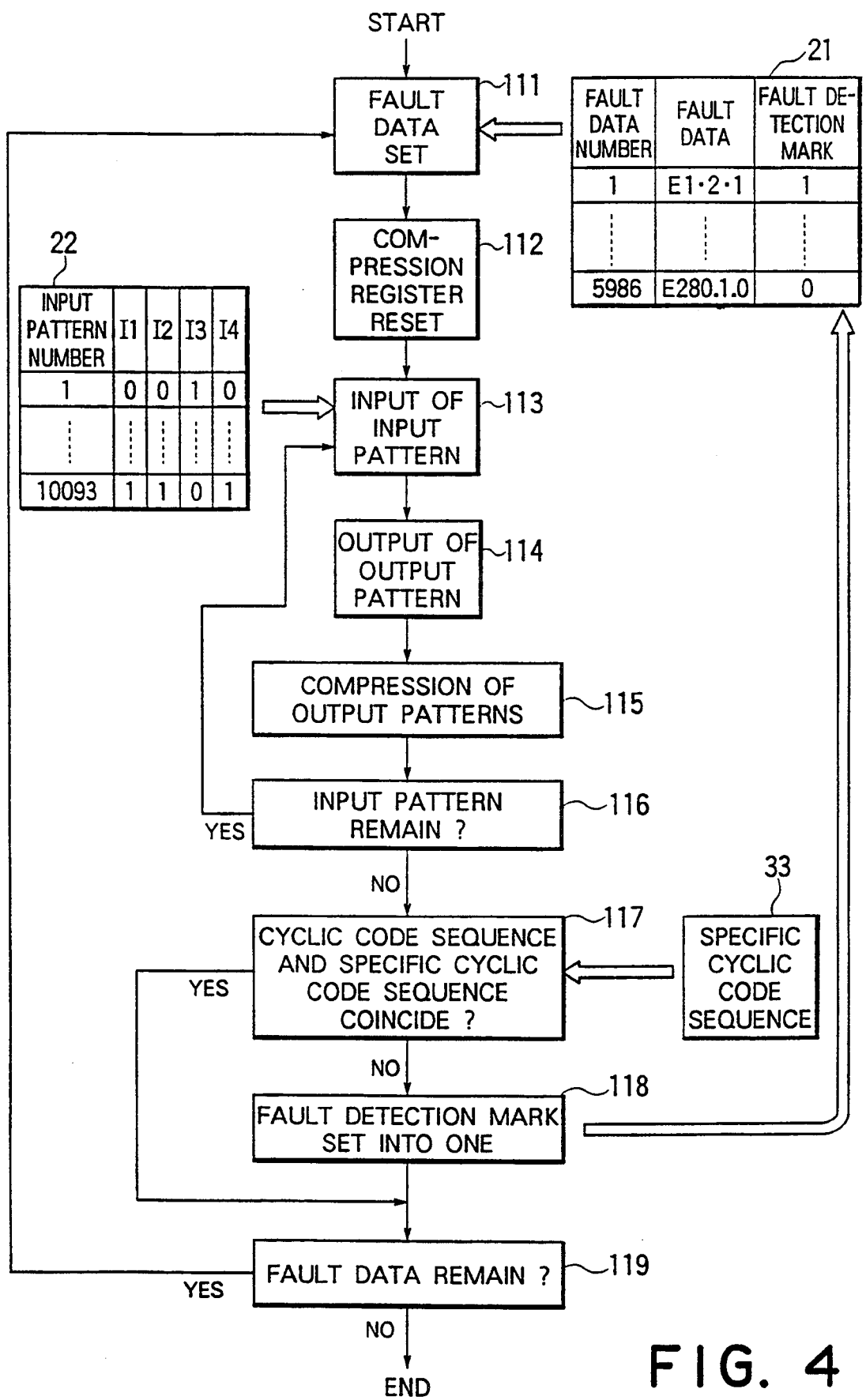
FIG. 4 is a flow chart for use in describing judging operation of the fault judging device illustrated in FIG. 3.

Referring to FIG. 4, the description will be made as regards a fault judging operation of the fault judging device according to this invention.

In FIG. 4, the fault data table 21 and the input data table 22 are similar to those illustrated in FIG. 2. At a first step 111, the first memorized fault data is read out of the control memory 31-2 by the controller 31-1 and is supplied to the circuit model 30-3 as a first fault data signal to define the first circuit element in the circuit model 30-3. At a second step 112, a first fault detection mark related to the first fault data is initialized to zero. Simultaneously, the controller 31-1 initializes the compression register 32-1 to all zero. At a third step 113, the first memorized input pattern is read out of the control memory 31-2 by the controller 31-1 and is supplied to the circuit model 30-3 as a first input pattern signal.

At a fourth step 114, the first input pattern signal is propagated through the circuit model 30-3. As a result, the circuit model 30-3 produces a first output pattern signal which represents a first output pattern. The first output pattern signal is supplied to the compression register 32-1 in the compression circuit 32. At a fifth step 115, the compression register 32-1 starts compression operation of the first output pattern signal in response to the first clock signal produced by the first clock generator 30-4. In synchronism with the second clock pulse signal produced by the second clock generator 32-2, the compression register 32-1 compresses the first output pattern signal into the compressed signal in a manner which is called a cyclic coding method. The compressed signal is represented by the cyclic code sequence consisting of sixteen bits. Note that compression of signals and the representation thereof by cyclic code sequences refers to techniques that are widely known in the art. For example, cyclic coding is described in U.S. Pat. No. 4,320,511.

At a sixth step 116, the controller 31-1 judges whether or not a remaining input pattern is present. If the remaining input pattern is not present, the sixth step 116 is followed by a seventh step 117. When the remaining input pattern is present, the sixth step 116 turns back to the third step 103. The third through the sixth steps are repeated in connection with the first circuit element E1 until the compression register 32-1 compresses the first through the n-th output pattern signals into the compressed signal represented by the cyclic code sequence of sixteen bits. On completion of the compression operation of the first through the n-th output pattern signals, the compression register 32-1 delivers the compressed signal to the comparator 34.

In addition, the first through the n-th input pattern signals may be generated by the circuit model unit 30 in accordance with the test program stored in the first memory 30-1. In this event, the first through the n-th input pattern signals are supplied to the circuit model 30-3 in synchronism with the first clock pulse signal produced by the first clock generator 30-4. The control memory 31-2 may store the fault data table only.

At the seventh step 117, the controller 31-1 supplies a read-out indication signal to the cyclic code memory 33. As a result, the memorized specific cyclic code sequence is read out of the cyclic code memory 33 and is supplied to the comparator 34 as a specific cyclic code signal. Supplied with the compression signal and the specific cyclic code signal, the comparator 34 compares the specific cyclic code sequence with the cyclic code sequence. If the cyclic code sequence does not coincide with the specific cyclic code sequence, the comparator 34 delivers a comparison result signal, as a judging result signal, representative of fault of the first circuit element. Then, the seventh step 117 is followed by an eight step 118. Otherwise, the seventh step 117 is succeeded by a ninth step 119.

At the eighth step 118, the controller 31-1 puts the fault detection mark related to the first fault data into one in response to the judging result signal. Then, the eighth step 118 is succeeded by the ninth step 119. At the ninth step 119, the control unit 31 judges whether or not remaining fault data are present. If the remaining fault data are not present, the fault judging operation is completed. When the remaining data are present, the ninth step 119 turns back to the first step 111. Then, the fault judging operation is carried out in connection with the circuit element defined by the second fault data through the first through the ninth steps 111 to 119. The fault judging operation is repeated until the fault data number becomes equal to 5986.

As obvious from the above description, the fault judging device according to this invention can carry out the comparing operation in a short time because the compression register 32-1 carries out the comparing operation once in connection with each of the first through the m-th fault data. Furthermore, the cyclic code memory 33 can be implemented by a register of a small capacity.

While this invention has thus far been described in conjunction with a preferred embodiment thereof, it will readily be possible for those skilled in the art to put this invention into practice in various other manners.

What is claimed is:

1. A fault judging device for use in simulating a circuit model which is defined by a fault data signal indicative of one of circuit elements in said circuit model to produce a judging result signal, said circuit model being operable in response to first through n-th input pattern signals and producing first through n-th output pattern signals where n represents a natural number greater than unity, said device comprising:

signal producing means connected to said circuit model for producing said fault data signal for selectively enabling said one of the circuit elements;

a compression circuit connected to said circuit model for compressing said first through said n-th output pattern signals by cyclic coding to produce a compressed signal represented by a cyclic code sequence;

a cyclic code memory for memorizing a specific cyclic code sequence which defines a normal circuit related to said circuit model; and comparing means connected to said compression circuit and said cyclic code memory for comparing said cyclic code sequence with said specific cyclic code sequence, said comparing means producing a comparison result signal, as said judging result signal, representative of a fault of said one of the circuit elements when said cyclic code sequence does not coincide with said specific cyclic code sequence.

2. A fault judging device as claimed in claim 1, wherein said signal producing means comprises a memory for memorizing fault data as memorized fault data to supply said memorized fault data to said circuit model as said fault data signal and memorizing first through n-th input patterns as first through n-th memorized input patterns to supply said first through said n-th memorized input patterns to said circuit model as said first through said n-th input pattern signals.

* * * * *